United States Patent
Shim et al.

(10) Patent No.: US 9,865,554 B2
(45) Date of Patent: *Jan. 9, 2018

(54) INTEGRATED CIRCUIT PACKAGING SYSTEM WITH UNDER BUMP METALLIZATION AND METHOD OF MANUFACTURE THEREOF

(71) Applicant: STATS ChipPAC Pte. Ltd., Singapore (SG)

(72) Inventors: Il Kwon Shim, Singapore (SG); Kyung Moon Kim, Seongnam (KR); HeeJo Chi, Yeoju-gun (KR); JunMo Koo, Singapore (SG); Bartholomew Liao Chung Foh, Singapore (SG); Zigmund Ramirez Camacho, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/955,033

(22) Filed: Nov. 30, 2015

(65) Prior Publication Data

US 2016/0099222 A1  Apr. 7, 2016

Related U.S. Application Data

(62) Division of application No. 14/140,829, filed on Dec. 26, 2013, now Pat. No. 9,202,793.

(51) Int. Cl.
*H01L 21/60* (2006.01)
*H01L 23/00* (2006.01)
*H01L 23/31* (2006.01)

(52) U.S. Cl.
CPC ............ *H01L 24/03* (2013.01); *H01L 24/05* (2013.01); *H01L 23/3192* (2013.01);
(Continued)

(58) Field of Classification Search
CPC .................. H01L 24/11; H01L 24/13; H01L 2224/03318; H01L 2224/03462;
(Continued)

(56) References Cited

U.S. PATENT DOCUMENTS 5,736,456 A   4/1998   Akram
5,851,911 A  12/1998   Farnworth
(Continued)

OTHER PUBLICATIONS

U.S. Appl. No. 14/140,829, Non-Final Office Action dated Apr. 2, 2015.
(Continued)

*Primary Examiner* — Mary Wilczewski
(74) *Attorney, Agent, or Firm* — Wong & Rees LLP

(57) ABSTRACT

An integrated circuit packaging system and method of manufacture thereof including: providing a substrate; forming contact pads on top of the substrate; forming a protection layer on top of the contact pads and the substrate; exposing the contact pads from the protection layer; printing under bump metallization (UBM) layers over the exposed contact pads extended over the protection layer with conductive inks; and forming bumps on top of the under bump metallization layers. It also including: printing an adhesion layer using conductive ink, wherein the adhesion layer comprises interconnected adhesion layer pads; forming additional under bump metallization (UBM) layers and bumps on top of the adhesion layer pads utilizing an electro-deposition process; and removing connections among the interconnected adhesion layer pads.

12 Claims, 10 Drawing Sheets

(52) U.S. Cl.
CPC ............ *H01L 24/11* (2013.01); *H01L 24/13* (2013.01); *H01L 2224/03001* (2013.01); *H01L 2224/039* (2013.01); *H01L 2224/0332* (2013.01); *H01L 2224/0347* (2013.01); *H01L 2224/03318* (2013.01); *H01L 2224/03462* (2013.01); *H01L 2224/03901* (2013.01); *H01L 2224/0401* (2013.01); *H01L 2224/0508* (2013.01); *H01L 2224/05022* (2013.01); *H01L 2224/05027* (2013.01); *H01L 2224/0558* (2013.01); *H01L 2224/05124* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05555* (2013.01); *H01L 2224/05569* (2013.01); *H01L 2224/05572* (2013.01); *H01L 2224/05664* (2013.01); *H01L 2224/1147* (2013.01); *H01L 2224/11462* (2013.01); *H01L 2224/11849* (2013.01); *H01L 2224/131* (2013.01); *H01L 2224/94* (2013.01); *H01L 2924/014* (2013.01)

(58) Field of Classification Search
CPC . H01L 2224/03901; H01L 2224/05027; H01L 2224/0558; H01L 2224/05583; H01L 2224/05584; H01L 2224/0508; H01L 2224/05082; H01L 2224/05083; H01L 2224/05084; H01L 2224/11462; H01L 2224/11849
USPC .................... 438/613, 614; 257/737, 738
See application file for complete search history.

(56) References Cited

U.S. PATENT DOCUMENTS

| | | | |
|---|---|---|---|
| 6,153,940 | A | 11/2000 | Zakel et al. |
| 6,443,059 | B1 | 9/2002 | Lee |
| 6,656,827 | B1 | 12/2003 | Tsao et al. |
| 6,716,738 | B2 | 4/2004 | Kim et al. |
| 6,814,454 | B2 | 11/2004 | Aziz et al. |
| 6,936,525 | B2 | 8/2005 | Nishiyama et al. |
| 6,992,001 | B1 | 1/2006 | Lin |
| 7,358,173 | B2 | 4/2008 | Shei et al. |
| 7,906,425 | B2 | 3/2011 | Su et al. |
| 8,048,776 | B2 | 11/2011 | Do et al. |
| 8,084,302 | B2 | 12/2011 | Do et al. |
| 8,674,507 | B2 * | 3/2014 | Chou ............... H01L 24/03 257/748 |
| 9,202,793 | B1 | 12/2015 | Shim et al. |
| 2002/0127836 | A1 | 9/2002 | Lin et al. |
| 2003/0134496 | A1 | 7/2003 | Lee et al. |
| 2004/0092092 | A1 | 5/2004 | Yang |
| 2005/0017355 | A1 * | 1/2005 | Chou ............... H01L 24/03 257/738 |
| 2010/0297842 | A1 | 11/2010 | Ke et al. |
| 2011/0115074 | A1 | 5/2011 | Hu et al. |
| 2012/0241951 | A1 | 9/2012 | Hu et al. |
| 2014/0004697 | A1 | 1/2014 | Shen |

OTHER PUBLICATIONS

U.S. Appl. No. 14/140,829, Non-Final Office Action dated Aug. 14, 2015.

* cited by examiner

INTEGRATED CIRCUIT PACKAGING SYSTEM WITH UNDER BUMP METALLIZATION AND METHOD OF MANUFACTURE THEREOF

CROSS-REFERENCE TO RELATED APPLICATION(S)

This is a divisional of co-pending U.S. patent application Ser. No. 14/140,829 filed Dec. 26, 2013, and the subject matter thereof is hereby incorporated herein by reference thereto.

TECHNICAL FIELD

The present invention relates generally to an integrated circuit packaging system, and more particularly to a system for applying under bump metallization layers.

BACKGROUND ART

Semiconductor chips have become progressively more complex, driven in large part by the need for increasing processing power in a smaller chip size for compact or portable electronic devices such as cell phones, smart phones, personal media systems, or ultraportable computers.

Typically, semiconductor chips are interconnected with other circuitry via an integrated circuit package that interfaces with semiconductor chips and attaches to a printed circuit board (PCB). One of the integrated circuit (IC) packages is a ball grid array (BGA) package.

Usually, a BGA package has an array of solder bumps attached to solder bump pads on a bottom external surface of a package substrate. The semiconductor chips or dies are attached to the IC package substrate. The signals of the semiconductor chips or dies are bonded with the package substrate via wires.

One type of the integrated circuit package is a wafer-level BGA package. In a Wafer-level BGA package, solder bumps are mounted directly to I/O pins of the IC chip before the chip is diced from the wafer. Wafer-level BGA package offers smaller footprint with high pin out comparing to other types of IC package.

Typically, I/O pads are adhered to solder bumps with one or more layers of metal, called under bump metallization layers. Under bump metallization (UBM) layers provide connectivity to integrated circuits while also providing greater adhesion for interconnects and protection from the outside. However, creating UBM structures at small scales with the required precision can be a difficult, time-consuming and expensive process.

Thus, a need still remains for a precise and cost-effective way of creating a UBM structure. In view of the shrinking sizes of electronic components, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; forming contact pads on top of the substrate; forming a protection layer on top of the contact pads and the substrate; exposing the contact pads from the protection layer; printing an under bump metallization (UBM) layer over the exposed contact pads extended over the protection layer with a conductive ink; and forming a bump on top of the UBM layer.

The present invention also provides a method of manufacture of an integrated circuit packaging system including: providing a substrate; forming contact pads on top of the substrate; forming a protection layer on top of the contact pads and the substrate; exposing the contact pads from the protection layer; printing an adhesion layer using conductive ink, wherein the adhesion layer comprises interconnected adhesion layer pads; forming additional under bump metallization (UBM) layers and bumps on top of the adhesion layer pads utilizing an electro-deposition process; and removing connections among the interconnected adhesion layer pads.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
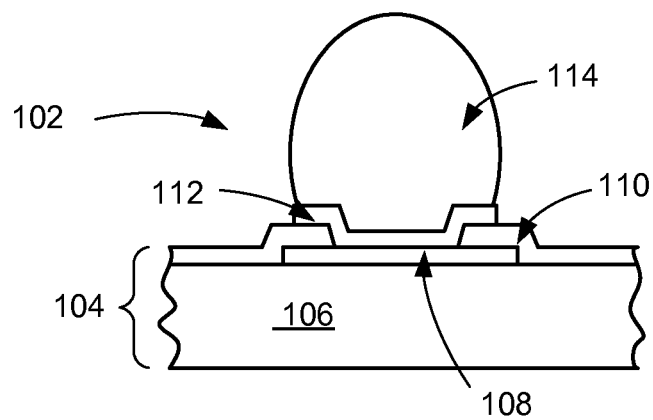
FIG. 1 is a cross-sectional view of a single layer under bump metallization (UBM) structure in an integrated circuit packaging system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Integrated circuit packaging system is the product of final stage of a semiconductor device fabrication, in which the integrated circuit component is encased in a supporting case that prevents physical damage and corrosion. The case, known as a package, supports the electrical contacts which connect the device to a circuit board. The package has external contacts to connect the encased integrated circuit component to other electronic components, such as a PCB board.

A common under bump metallization (UBM) structure includes a single or multiple layers of metallurgy deposited on top of contact pads. A bump is formed on the top of the UBM layer. During packaging process, the input-output (I/O) pads of an integrated circuit (IC) chip are attached to the bumps. Therefore the IC chip is connected with the external package system via the bumps and the conductive pads of the packaging system.

The UBM structure can have a single or multiple layers. When the UBM has multiple layers, each layer of a standard UBM serves a specific function. For instance, the first layer of UBM deposited on top of the contact pads, provides good adhesion to the contact pads. The second layer of UBM deposited on top of the first UBM layer, serves as a solder diffusion barrier. The third layer of UBM deposited on top of the second UBM layer, provides a solder-wettable layer. The final layer of UBM deposited on top of the third UBM layer, is an anti-oxidation finish.

Conventional under bump metallization (UBM) process uses patterned photo-resist to mask for UBM deposition. The UBM layers are deposited on the patterned areas layer upon layer. The photo-resist is etched away after deposition of the UBM and before the formation of bumps, such as solder bumps.

This process involves many additional steps and special equipment to create patterns and remove them after the deposition of the UBM. The spin coating process for photo-resist application has high material wastage, besides a high cost photo-resist material. The formation of the UBM is highly reliant on the photo-lithography processes, which is difficult to be precisely for a smaller size complex chip, due to high density of the contacts where the UBM formed on, and close spaces between them.

In an electro-deposition process, high cost and high maintenance process of sputtering/PVD is an issue. Wastage of sputtering material, and application and removal of photo-resist all add to the cost of the process. The additional steps in the process add complexity and make it difficult to monitor and ensure the electro-deposited UBM quality.

It has been found that wafer-level packaging system printing the UBM layers using ink jet printing or stencil printing with conductive ink provides smaller and thinner UBM layers allowing smaller semiconductor packages. The printing process uses different conductive inks for different UBM layers. By dispensing conductive inks directly over the desired UBM deposition areas, the printing process avoids the high cost photo-resist pattern application and removal processes. The conductive ink is made of fine metallic nanoparticles to ensure the printed ink thickness uniformity.

The UBM fabrication method of embodiments of the present invention is characterized and differentiated by its ability to directly form the desired UBM layers by means of ink jet or screen printing with solderable conductive ink, and curing the conductive ink by heat or UV light. This is done so without the need for any photolithography patterning such as necessary for conventional UBM deposition methods that use vapor deposition, electrolytic plating, and/or electro-less plating.

In addition to its ability for direct printing of the UBM layer in different embodiments, it has been found that embodiments of the present invention greatly simplify the UBM process. It has been found that the use of a highly standardized ink preparation ensures the predefined amount and consistency of material is dispensed in every printing action. This is in contrast to the complicated process controls and preparations needed for electroplating and PVD just to ensure that the right plating thickness and metal compositions are achieved.

The dispensing equipment is able to dispense fine droplets of low viscosity inks, ensures uniformity of dispense. The dispensing equipment is able to accommodate a wide range of inks with high solids loadings and viscosities from 1 to 100 centipoise (cP). The dispensing equipment has no contact with the wafer surface, provides conformal printing with high stand-off distances of 2-5 mm. Since there is no contact with the printing surface, conductive ink can be printed evenly on textured, stepped and curved surfaces. The dispensing equipment with fine metallic conductive ink has ability to control the print rate dynamically to create low or high-resistivity interconnects. A single nozzle ink dispensing can print at a rate up to 10 mg/min, with a printed feature sizes ranging from 10 um to several mm. The conductive ink can be made of conductive material, includes a silver nanoparticle ink, a UV cure dielectric ink, a carbon-based resistive ink, or a thermal cure dielectric ink.

There are two major printing systems to print UBM layers in an IC packaging system, ink jet and stencil printing.

The ink jet printing system is able to dispense a controlled finite amount of ink as determined by the ink jet nozzles, thereby promoting a printout with highly-consistent thickness and form. The ink jet printing system uses an ink droplet to dispense a uniform thickness of conductive ink on the wafer surface. The ink jet printing system controls the movement of ink droplet to dispense a consistent thickness of conductive ink on the desired areas. Multiple passes can be applied for adding thickness.

Similarly, a stencil printing system can provide a simpler, lower cost process. The stencil printing system typically provides a screen covered with conductive paste. The screen is placed over the top of the entire wafer surface. The stencil printing system controls the movement of squeegees to push the conductive paste through the screen to be deposited on the desired areas to form UBM layers.

There may be other ways to deposit conductive paste, such as spray coating the conductive paste through the screen on the desired areas to form UBM layers.

Generally, the conductive paste is thicker than the conductive ink. In UBM formation, the thicker conductive paste would generally tend to create an unnecessarily thicker UBM layers due to the material's consistency, and compounded with the fact that the stencil cannot be made too thin. The thickness of the conductive paste would usually take on the stencil's thickness.

Present invention uses conductive ink to replace the conductive paste in stencil printing. The conductive ink usually is a suspension of metallic nano-particles in a polymer resin base, can be used to form thinner UBM layers with a more controlled thickness. Although the conductive ink has been used in the ink jet printing system, it remains a challenge to use it in the stencil printing system due to equipment limitations.

In stencil printing with conductive ink, special considerations have to be taken to produce a controlled UBM thickness & surface. A finer or thinner stencil would be needed, and a specially formulated conductive ink would also be needed. For example, a specially formulated conductive ink can be applied thinly through a stencil, and keep its shape, hold it and not smear even after the stencil is released. The conductive ink's thixotropic index must be specially or accordingly high for this purpose.

More advanced stencil printing system may be needed, such as a micro-stencil or vacuum stencil system. A micro-stencil system may be needed to print conductive ink layers in the thickness ranges of 10-15 um. A vacuum stencil system may be needed to provide a mechanism to press the stencil or screen firmly onto the water surface during printing to produce well-defined printed features and avoid ink smearing.

The current invention teaches in embodiments that, to overcome the above technological challenges, advanced stencil printing systems using special formulated conductive ink, are able to print fine thinner UBM layers, and to have a high throughput.

In some cases, printing conductive ink as an adhesion/seed layer is followed by electro-deposition of the rest UBM. Here, the adhesion layer typically is sputtered covering entire surface of a wafer before the adhesion layer is patterned by photo-resist. After deposition of the rest UBM layers, the unwanted areas of the adhesion layer are etched. This is wastage of the adhesion layer material. As the chip size shrinks, it is getting difficult to mask and etch the unwanted adhesion layer between UBMs.

In one embodiment of the present invention, a selectively deposited adhesion layer is used. This is differentiated from a sputtered adhesion layer on entire wafer surface. The adhesion layer is deposited on the selected areas, including the contact pad and the passivation rims to form adhesion layer pads, with adhesion layer bars connecting individual adhesion layer pads. This introduces cost advantages by limiting adhesion layer coverage, to avoid wastage of the adhesion layer material, and for a better throughput.

Other advantages can include that the conductive ink used to print the selectively deposited adhesion layer, does not need to be titanium (Ti) based, as in usual sputtered adhesion layer process. Titanium is the type of metal that can be sputtered and expected to have good adhesion with the wafer and Al pad surface. Printed by conductive ink, the selectively deposited adhesion can be achieved without need for Ti.

The selectively deposited adhesion layer also eliminates the need for a subsequent full adhesion layer etching. It is essential for removing unwanted connections between individual crates to avoid unwanted circuit short. As the chip size minimized, it becomes more difficult for a perfect full adhesion layer etching. When the full adhesion layer is under-etched, the unwanted connection between crates may cause unexpected circuit short. When the full adhesion layer is over-etched, the over etching may damage the UBM structure, causes poor bonding, weak support, and possible circuitry failure.

In a different embodiment, a dry film resist (DFR) mask is used to form selectively deposited adhesion layer. The dry film resist is patterned on top of the substrate extended over the edge of the contact pads, leaving the centre of the contact pads exposed for deposition. Conductive material, such as conductive ink is deposited through the patterned openings of the dry film resist mask by means of squeegee application stencil printing, or by means of spraying coating or full coverage ink jetting.

Further, it is found that, UV curable conductive ink can be used to print an UBM using only one type of ink. The conductive ink can be conductive ink with one type of metal particles, including Copper (Cu), Nickel (Ni), or Chromium (Cr). It can be conductive ink with metal alloy particles, including Cu—Cr or Cu—Ni. It can also be conductive ink with a mixture of different metal particles, including Cu+Cr or Cu+Ni.

In a different embodiment, the above multifunctional UBM single layer can be printed with one type of conductive ink, including single metal, metal alloy, or mixture of metals. This UBM conductive ink has good adhesion characteristics, solder diffusion resistance, solderability and resists oxidation. Optionally, a gold (Au) surface finish can be applied to the UBM as oxidation barrier.

The present invention is not limited to only the mentioned types of metal and the number of functional layers shown.

It has been discovered that using conductive paste in stencil printing is limited by conductive paste larger particle size, higher concentration, and greater individual viscosities of base. The conductive paste would result to a thicker printed material. This limits its ability to print a thinner UBM layer desired as the IC chip getting smaller and more complex.

It has been unexpectedly discovered that the conductive ink used in the stencil printing system can print a thinner UBM layer as desired. It was further discovered that, printing a selectively deposited adhesion layer followed by electro-deposition of the UBM and solder bump, it avoids wastage of the adhesion materials caused by sputtering plating. It eliminates the damage caused by full adhesion layer etching by selective removal adhesion layer connections.

Thus, it has been discovered that the methods of manufacturing integrated circuit packaging system of the present invention furnish important and heretofore unknown and unavailable solutions, capabilities, and functional aspects for depositing of predetermined uniformed thickness UBM layers, utilizing conductive ink in stencil printing, simplifying manufacturing process, eliminating material wastage, reducing cost, and minimizing damages to the IC packaging system.

Referring now to FIG. 1, therein is shown a cross-sectional view of a single layer under bump metallization (UBM) structure in an integrated circuit packaging system in accordance with an embodiment of the present invention. A single layer under bump metallization (UBM) structure 102 is positioned in an integrated circuit (IC) packaging system 100. The IC packaging system 100 can be a substrate, an integrated circuit, or a semiconductor wafer 104. The semiconductor wafer 104 can include a substrate, such as a silicon substrate 106, a contact pad, such as an aluminum pad 108, an incoming die protection layer, such as a passivation layer 110. The passivation layer 110 covers the entire surface of the silicon substrate 106 and the edges of the aluminum pads 108, having the center of the aluminum pads 108 exposed to a UBM layer 112.

The UBM layer 112 is deposited on the entire exposed aluminum pad 108, and extended over the edges of the passivation layer 110. A solder bump 114 is formed on top of the UBM layer 112. The UBM layer 112 is a layer of metallurgy material including a single type of metal, metal alloy, or a mixture of metals. Depending on the deposition methods and systems, the metallurgy used in UBM layer can include, but not limited to Cr, Cu, Au, Ni, or a combination thereof.

The overlap of the passivation layer 110 and the aluminum pad 108 ensures the UBM layer 112 is connected with the aluminum pad 108 without exposing the silicon substrate 106. The overlap of the UBM layer 112 over the passivation layer 110 provides a solid support and good bonding for the solder bump 114. The main purpose and functions of UBM structure 102 is to provide solder bump capture, a solder migration barrier, a solder wettable layer, and a stress absorber.

The UBM structure 102 in this embodiment has a single UBM layer 112. However, the UBM structure can have more than one UBM layers. The multiple layer UBM structure will be discussed in more detail with respect to other embodiments.

Figure 2:
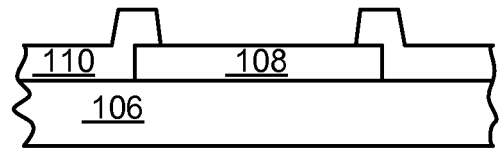
FIG. 2 is a cross-sectional view of a single layer UBM structure in an early stage of manufacture in accordance with an embodiment of the present invention.

Referring now to FIG. 2, therein is shown a cross-sectional view of a single layer UBM structure in an early stage of manufacture in accordance with an embodiment of the present invention. The aluminum pad 108 is deposited on top of the silicon substrate 106 at the location where the solder bump 114 is going to be formed. The passivation layer 110 is deposited to cover the entire surface of the silicon substrate 106, over the edge of the aluminum pad 108 with a margin, leaving the center of the aluminum pad 108 exposed.

Figure 3:
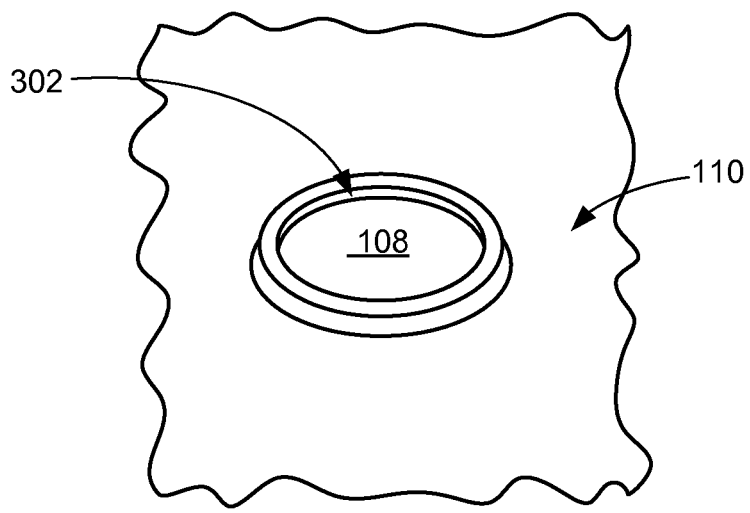
FIG. 3 is an isometric of the top view of FIG. 2.

Referring now to FIG. 3, therein is shown an isometric of the top view of FIG. 2. The entire surface of the silicon substrate 106 and the edge of the aluminum pad 108 are covered by the passivation layer 110. A passivation layer rim 302 is formed over the edge of the aluminum pad 108, leaving the center of the aluminum pad 108 exposed, patterning the area for deposition of the UBM layer 112.

Figure 4:
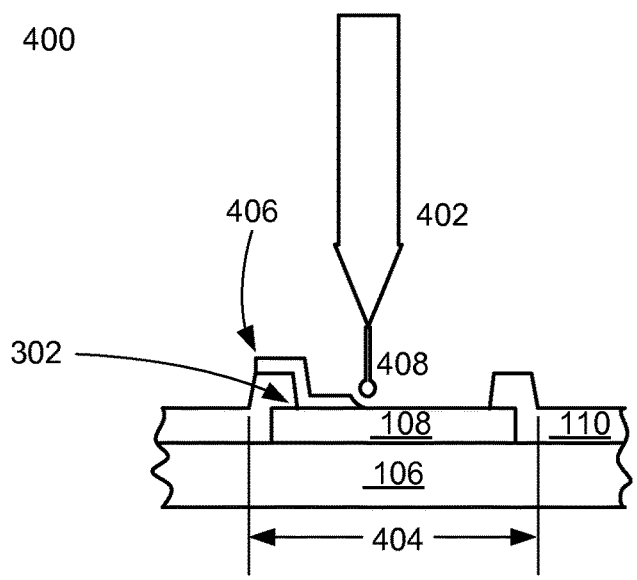
FIG. 4 is a cross-sectional view of FIG. 2 when an ink jet printing a single layer UBM in accordance with an embodiment of the present invention.

Referring now to FIG. 4, therein is shown a cross-sectional view of FIG. 2 when an ink jet printing the single UBM layer 112 of FIG. 1 in accordance with an embodiment of the present invention. An ink jet printing system 400 has one ink droplet of ink droplets 402 placed over a desired deposition area 404. The ink jet printing system 400 controls the ink droplets 402 to move from a starting point 406, over the passivation layer rim 302, crossing the exposed surface of the aluminum pad 108. A highly-consistent layer of conductive ink 408 made of UBM material is dispensed on the surface of the passivation layer rim 302 and the aluminum pad 108 as the ink droplets 402 moves above the desired deposition area 404.

The conductive ink 408 is made of conductive metal, metal alloy, or mixture of different type of metals. The thickness of the UBM layer depends on predetermined amount of the conductive ink 408 dispensed, and is controlled by the ink jet printing system 400. The ink jet printing system 400 has no contact with the desired deposition area 404 and prints with high stand-off distances of 2-5 mm. Because of the non-contact printing, the ink droplet 402 is able to print on textured, stepped, and curved surfaces with a highly-consistent thickness. The deposition surface shown in FIG. 4 is a stepped and curved surface. By utilizing the ink jet printing, a uniformed thickness UBM layer is printed or deposited on the desired deposition area 404.

Figure 5:
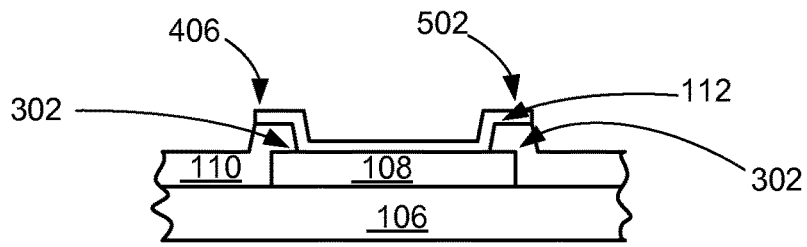
FIG. 5 is a cross-sectional view of FIG. 4 after the single UBM layer is completed in accordance with an embodiment of the present invention.

Referring now to FIG. 5, therein is shown a cross-sectional view of FIG. 4 after the single UBM layer 112 is completed in accordance with an embodiment of the present invention. The ink droplets 402 starts from the starting point 406, moves over one section of the passivation layer rim 302, crosses entire exposed surface of the aluminum pad 108, moves over another section of the passivation layer rim 302 and ends at a finishing point 502.

The conductive ink 408 is dispensed along the line from the starting point 406 to the finishing point 502. A group of the ink droplets 402 dispense the conductive ink 408 concurrently to deposit the UBM layer 112 on the desired deposition area 404.

Figure 6:
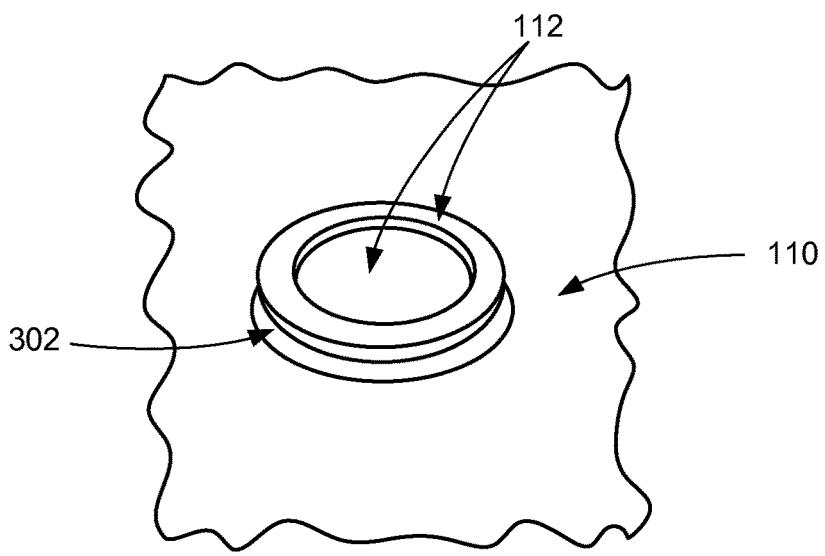
FIG. 6 is an isometric of the top view of FIG. 5.

Referring now to FIG. 6, therein is shown an isometric of the top view of FIG. 5. The UBM layer 112 covers the entire exposed aluminum pad 108 and the passivation layer rim 302. It provides good contact with the aluminum pad 108. The aluminum pad 108 is completely covered by the passivation layer 110 and the UBM layer 112. This ensures the aluminum pad 108 can be connected to other circuitry through the UBM layer 112 only to avoid unwanted short circuits.

Figure 7:
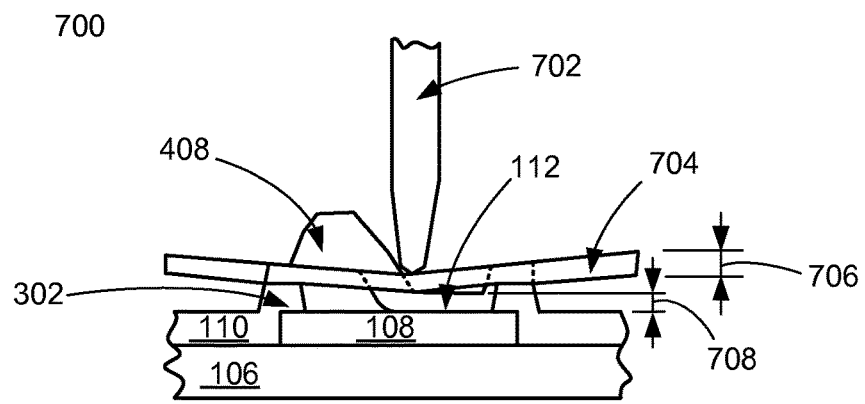
FIG. 7 is a cross-sectional view of FIG. 2 while a stencil printing system is printing the single UBM layer in accordance with an embodiment of the present invention.

Referring now to FIG. 7, therein is shown a cross-sectional view of FIG. 2 while a stencil printing system is printing the single UBM layer 112 in accordance with an embodiment of the present invention. A stencil printing system 700 utilizes a squeegee 702 to squeeze the conductive ink 408 out of a screen 704 on the desired area. The squeezed out conductive ink 408 is printed or deposited on the surface of the passivation layer rim 302 and the exposed aluminum pad 108 to form the UBM layer 112.

The screen 704 covers entire surface of the semiconductor wafer 104 of FIG. 1. It has a uniform screen thickness 706. As the squeegee 702 squeezes the conductive ink 408 out of the screen 704, the UBM layer 112 is deposited on the desired surface with a consistent UBM layer thickness 708. The consistent UBM layer thickness 708 of the UBM layer 112 is as same as the uniform screen thickness 706. This is an effective way to precisely control the consistent UBM layer thickness 708 by providing the screen 704 with a desired thickness.

The present invention uses conductive ink 408 for stencil printing to replace conventionally used conductive paste because it has been discovered that conductive paste cannot be made thin enough for embodiment of the present invention.

Figure 8:
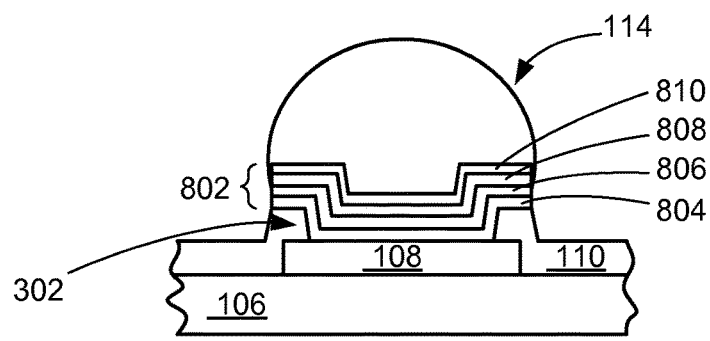
FIG. 8 is a cross-sectional view of a multi-layer UBM structure in an integrated circuit packaging system in accordance with an embodiment of the present invention.

Referring now to FIG. 8, therein is shown a cross-sectional view of a multi-layer UBM structure in an integrated circuit packaging system 100 in accordance with an embodiment of the present invention. The multi-layer UBM structure, for example, can be a multi-layer UBM structure 802 deposited on top of the aluminum pad 108 extended over the passivation layer rim 302.

As described in FIG. 1, the IC packaging system 100 includes the silicon substrate 106, the aluminum pad 108, and the passivation layer 110.

The multi-layer UBM structure 802 can have different layers to serve specific functions. The first UBM layer deposited on the desired surface is a seed layer or an adhesion layer 804.

The adhesion layer 804 provides good adhesion between the aluminum pad 108 and the structure above the aluminum pad 108. The conductive ink used to print the adhesion layer 804 is made of, but not limited to Cr, Titanium (Ti), or titanium-tungsten (TiW).

A solder diffusion barrier layer 806 is deposited on top of the adhesion layer 804. The solder diffusion barrier layer 806 prevents diffusion from the solder bump 114. The conductive ink used to print the solder diffusion barrier layer 806 is made of, but not limited to, Cu, Cr—Cu, or Ni.

On top of the solder diffusion barrier layer 806, a solder wettable layer 808 is deposited. The solder wettable layer 808 provides enhancement of wetting with the solder bump 114. The conductive ink used to print the solder wettable layer 808 is made of, but not limited to Cu or Au.

The final layer deposited on top of the solder wettable layer 808 is an oxidation barrier layer 810. The oxidation barrier layer 810 is an anti-oxidation finish on the multi-layer UBM structure 802. The conductive ink used to print the oxidation barrier layer 810 is made of, but not limited to, Au or Palladium (Pd).

The solder bump 114 is formed on top of the multi-layer UBM structure 802, adjacent to the oxidation barrier layer 810.

Figure 9:
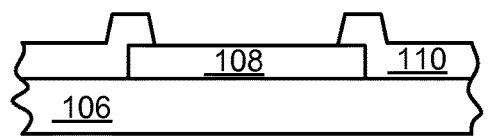
FIG. 9 is a cross-sectional view of a multi-layer UBM structure in an early stage of manufacture in accordance with an embodiment of the present invention.

Referring now to FIG. 9, therein is shown a cross-sectional view of a multi-layer UBM structure 802 in an early stage of manufacture in accordance with an embodiment of the present invention. As described in FIG. 2, the aluminum pad 108 and the passivation layer 110 are formed on top of the silicon substrate 106.

Figure 10:
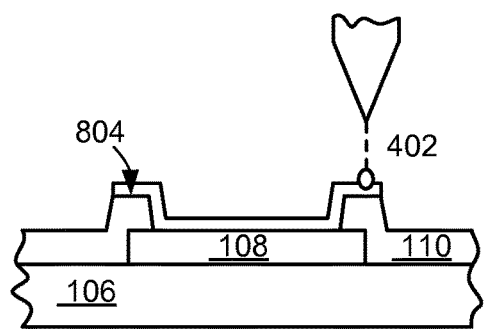
FIG. 10 is FIG. 9 after the adhesion layer has been ink jet printed in accordance with an embodiment of the present invention.

Referring now to FIG. 10, therein is shown FIG. 9 after the adhesion layer 804 has been ink jet printed in accordance with an embodiment of the present invention. As described in FIG. 5, the conductive ink 408 made of adhesion layer metallurgy is dispensed through the ink droplet 402 to print the adhesion layer 804 on the desired surface. The adhesion layer 804 provides good adhesion for the aluminum pad 108.

Figure 11:
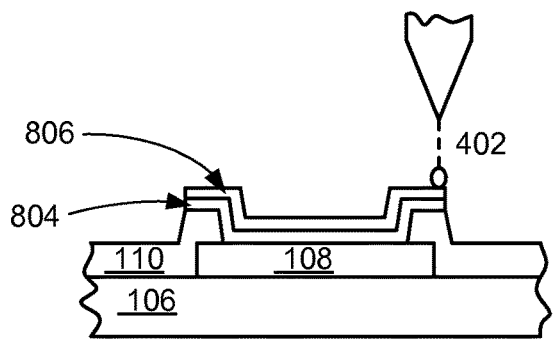
FIG. 11 is FIG. 10 after the solder diffusion barrier layer has been ink jet printed in accordance with an embodiment of the present invention.

Referring now to FIG. 11, therein is shown FIG. 10 after the solder diffusion barrier layer 806 has been ink jet printed in accordance with an embodiment of the present invention. As described in FIG. 5, the conductive ink 408 is made of diffusion barrier layer metallurgy and is dispensed through the ink jet printing system 400 of FIG. 4 to print the solder diffusion barrier layer 806 on the desired surface. The solder diffusion barrier layer 806 provides a diffusion barrier for the solder bump 114. An oxidation barrier layer 810 provides an anti-oxidation barrier for the solder bumps 114.

Figure 12:
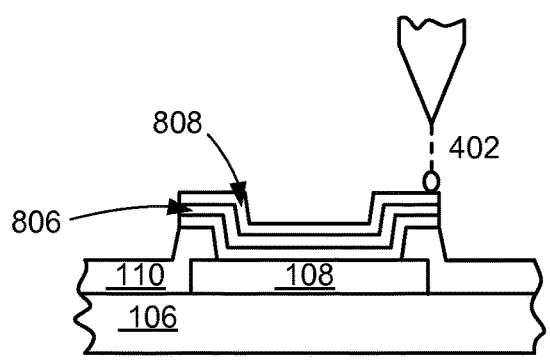
FIG. 12 is FIG. 11 after the solder wettable layer has been ink jet printed in accordance with an embodiment of the present invention.

Referring now to FIG. 12, therein is shown FIG. 11 after the solder wettable layer 808 has been ink jet printed in accordance with an embodiment of the present invention. As described in FIG. 5, the conductive ink 408 made of solder wettable layer metallurgy is dispensed through the ink jet printing system 400 of FIG. 4 to print the solder wettable layer 808 on the desired surface. The solder wettable layer 808 enhances wetting for the solder bump 114.

Figure 13:
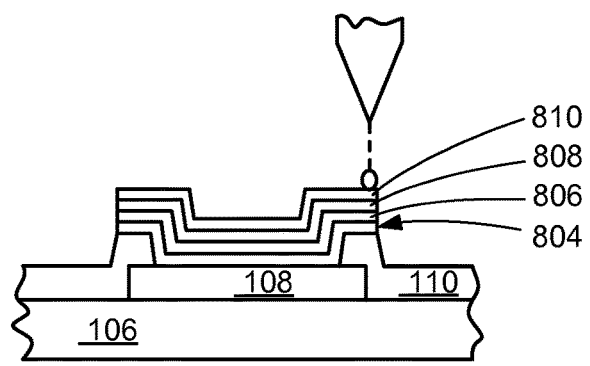
FIG. 13 is FIG. 12 after the oxidation barrier layer has been ink jet printed in accordance with an embodiment of the present invention.

Referring now to FIG. 13, therein is shown FIG. 12 after the oxidation barrier layer 810 has been ink jet printed in accordance with an embodiment of the present invention. As described in FIG. 5, the conductive ink 408 made of oxidation barrier layer metallurgy is dispensed through the ink jet printing system 400 of FIG. 4 to print the oxidation barrier layer 810 on the desired surface. The oxidation barrier layer 810 provides an anti-oxidation barrier for the solder bumps 114.

In a different embodiment discussed below, an electro-deposition is utilized for the deposition of the UBM layers other than the adhesion layer 804 and the solder bumps 114.

Figure 14:
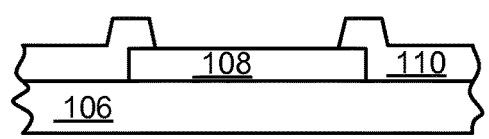
FIG. 14 is FIG. 2 in a different embodiment in which the ink printing process followed by an electro-deposition of the UBM layers and the solder bumps in accordance with an embodiment of the present invention.

Referring now to FIG. 14, therein is shown FIG. 2 in a different embodiment in which the ink printing process followed by an electro-deposition of the UBM layers and the solder bumps in accordance with an embodiment of the present invention. The passivation layer 110 and the aluminum pad 108 are formed on top of the silicon substrate 106.

Figure 15:
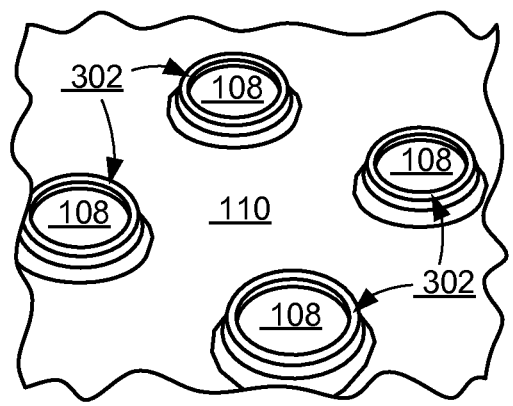
FIG. 15 is an isometric of the top view of FIG. 14.

Referring now to FIG. 15, therein is shown an isometric of the top view of FIG. 14. The entire surface of the silicon substrate is covered by the passivation layer 110. The passivation layer rim 302 appears in multiple locations to pattern the area for deposition of the UBM layers.

Figure 16:
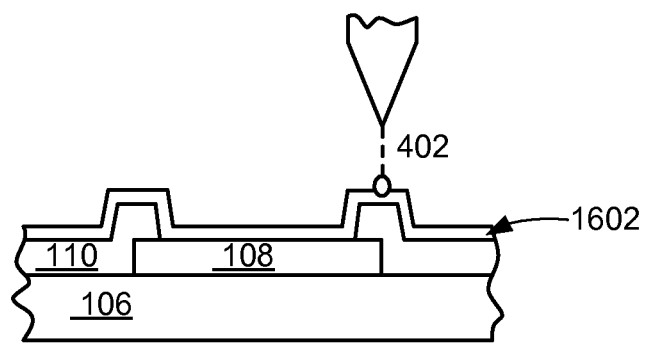
FIG. 16 is FIG. 14 after a selectively deposited adhesion layer is ink jet printed in accordance with an embodiment of the present invention.

Referring now to FIG. 16, therein is shown FIG. 14 after a selectively deposited adhesion layer 1602 is ink jet printed in accordance with an embodiment of the present invention. The conductive ink 408 made of adhesion layer material is printed on selected areas of the passivation layer 110 and the exposed aluminum pads 108. In a conventional process, the adhesion layer material is sputtering plated on entire surface of the semiconductor wafer 104 of FIG. 1. In contrast to a conventional process, the selectively deposited adhesion layer 1602 covers the limited selected areas of the semiconductor wafer 104. A selectively deposited adhesion layer 1602 is printed by ink jet printing system or stencil printing system with the conductive ink 408.

Figure 17:
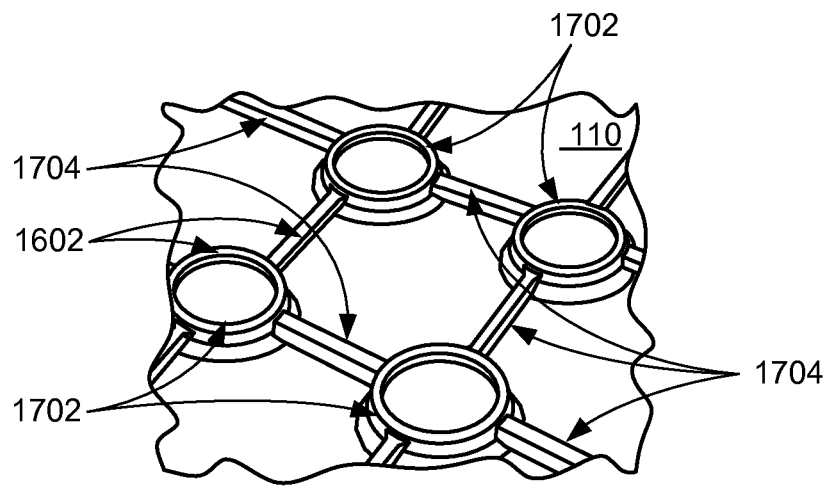
FIG. 17 is an isometric of the top view of FIG. 16.

Referring now to FIG. 17, therein is shown an isometric of the top view of FIG. 16. The selectively deposited adhesion layer 1602 includes adhesion layer pads 1702 and adhesion layer bars 1704. The adhesion layer pads 1702 cover the exposed surface of the aluminum pads 108 and the passivation layer rims 302. The adhesion layer bars 1704 connect individual adhesion layer pads 1702 for the future electro-deposition process.

Figure 18:
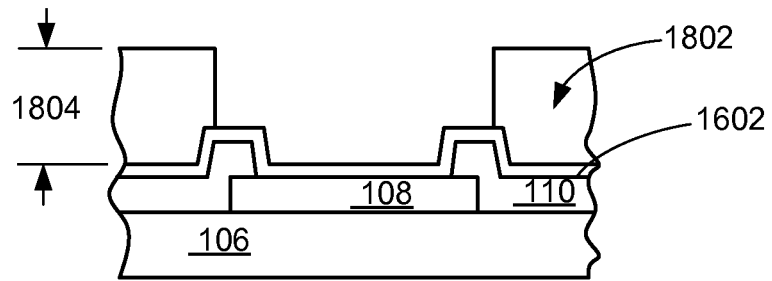
FIG. 18 is FIG. 16 after a patterned photo-resist is formed in accordance with an embodiment of the present invention.

Referring now to FIG. 18, therein is shown FIG. 16 after a patterned photo-resist 1802 is formed in accordance with an embodiment of the present invention. The patterned photo-resist 1802 is deposited on the selectively deposited adhesion layer 1602 and the passivation layer 110, to mask out the area for electro-deposition for the rest of the UBM layers. A height 1804 of the patterned photo-resist 1802 is greater than the combined thickness of the rest of the UBM layers.

Figure 19:
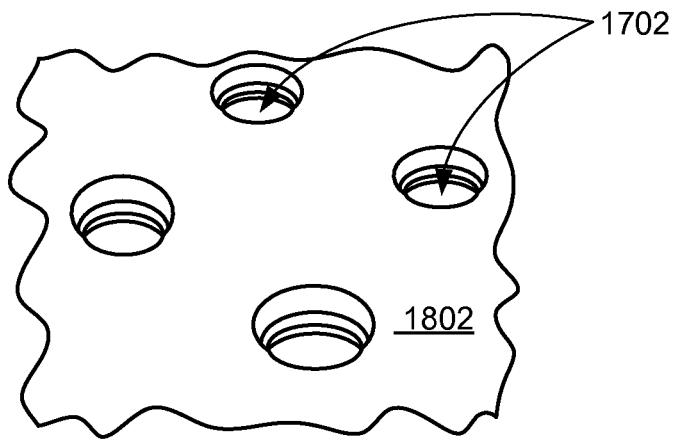
FIG. 19 is an isometric of the top view of FIG. 18.

Referring now to FIG. 19, therein is shown an isometric of the top view of FIG. 18. The patterned photo-resist 1802 covers the adhesion layer bars 1704 and the edges of the adhesion layer pads 1702, leaving the centers of the adhesion layer pads 1702 for the electro-deposition of the rest UBM layers.

Figure 20:
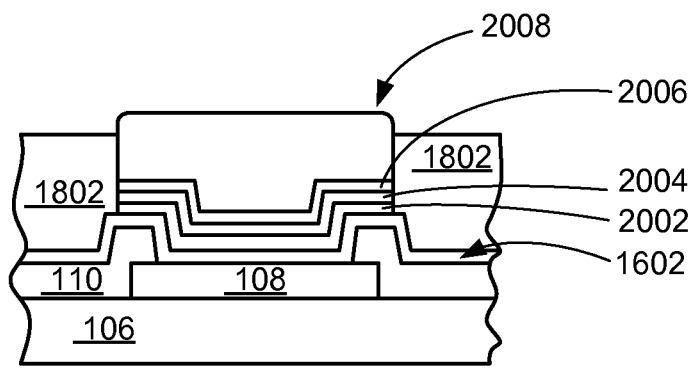
FIG. 20 is FIG. 18 after electro-deposition of the rest UBM layers and solder bumps in accordance with an embodiment of the present invention.

Referring now to FIG. 20, therein is shown FIG. 18 after electro-deposition of the rest UBM layers and solder bumps in accordance with an embodiment of the present invention. On top of the selectively deposited adhesion layer 1602, a solder diffusion barrier layer 2002, a solder wettable layer 2004, an oxidation barrier layer 2006, and a solder bump 2008 are electro-deposited within the patterned photo-resist 1802, layer upon layer.

The top surface of the solder bump 2008 is slightly higher than the top surface of the patterned photo-resist 1802.

Figure 21:
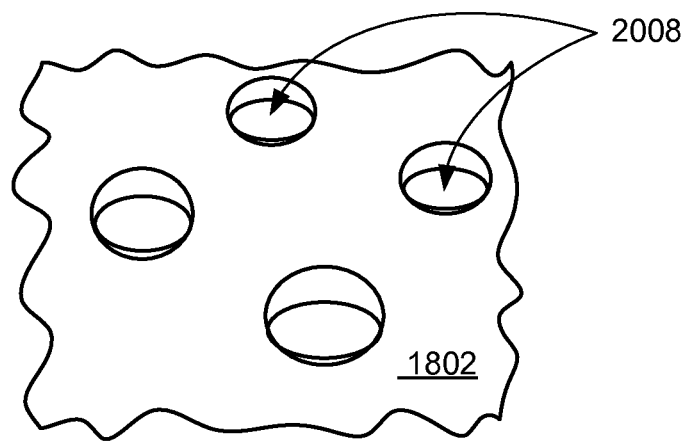
FIG. 21 is an isometric of the top view of FIG. 20.

Referring now to FIG. 21, therein is shown an isometric of the top view of FIG. 20. The surfaces of the solder bump 2008 extend out of the patterned photo-resist 1802.

Figure 22:
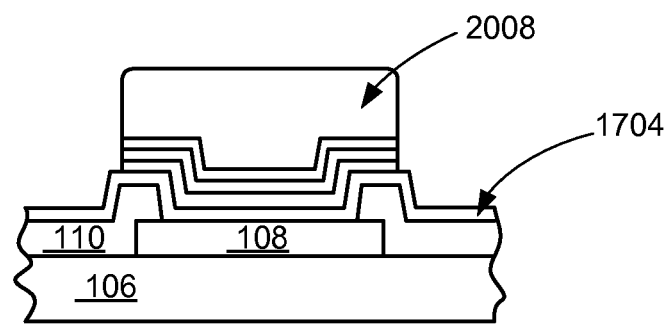
FIG. 22 is FIG. 20 after the patterned photo-resist has been removed.

Referring now to FIG. 22, therein is shown FIG. 20 after the patterned photo-resist 1802 has been removed. The adhesion layer bars 1704 are exposed, along with the vertical sides of multiple UBM layers and the solder bump 2008.

Figure 23:
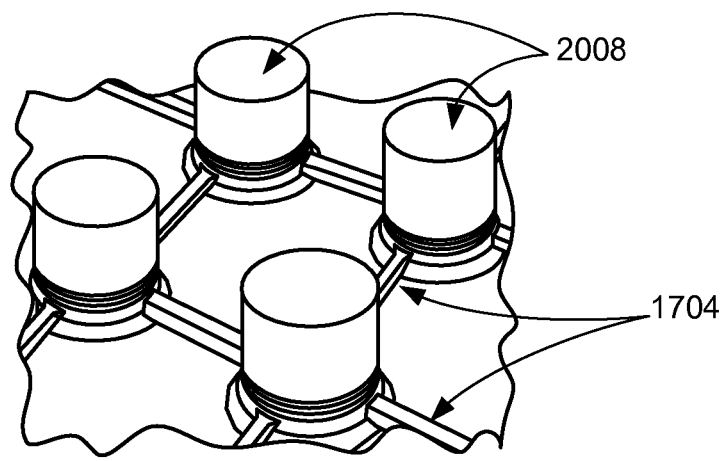
FIG. 23 is an isometric of the top view of FIG. 22.

Referring now to FIG. 23, therein is shown an isometric of the top view of FIG. 22. The solder bumps 2008 and supporting multiple UBM layers are formed by electro-deposition. Individual solder bumps 2008 and the UBM layers underneath them are interconnected via the adhesion layer bars 1704. The connections are necessary for the electro-deposition process.

Figure 24:
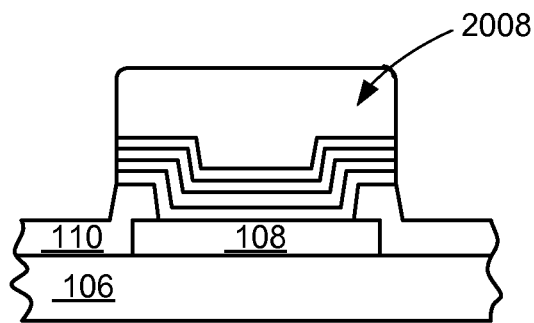
FIG. 24 is FIG. 22 after the adhesion layer etching in accordance with an embodiment of the present invention.

Referring now to FIG. 24, therein is shown FIG. 22 after the selectively deposited adhesion layer 1602 is etched in accordance with an embodiment of the present invention. After the electro-deposition of the UBM layers and the solder bumps, the connections among the adhesion layer pads 1702 are no longer needed. An etching process removes those connections. The individual solder bumps and the UBM layers supporting them are disconnected from each other.

A conventional etching process removes the exposed selectively deposited adhesion layer 1602 completely, including the adhesion layer bars 1704 and the vertical surfaces of the adhesion layer pads 1702. As the chip size decreased and complexity increased, it is difficult to control the etching process to accomplish a precise etching. Over etching or under etching the selectively deposited adhesion layer 1602, may damage the UBM layers, impact bonding and supporting the solder bumps 2008, and create unwanted short circuits in some cases.

In contrast to conventional sputtering plating of adhesion layer material on entire wafer surface, the selectively deposited adhesion layer 1602 has limited connections via the adhesion layer bars 1704 among the UBM structures. By etching off a portion of the adhesion layer bars 1704, the interconnections among the UBM structures are removed. In comparison to the removal of the adhesion layer material on entire wafer surface, it is easier to control the etching process to remove only a portion of the adhesion layer bar 1704. The etching does not have to be precise as long as the individual UBM structures are disconnected. This is an effective way to avoid over-etching or under-etching, which creates problems in conventional etching process.

Figure 25:
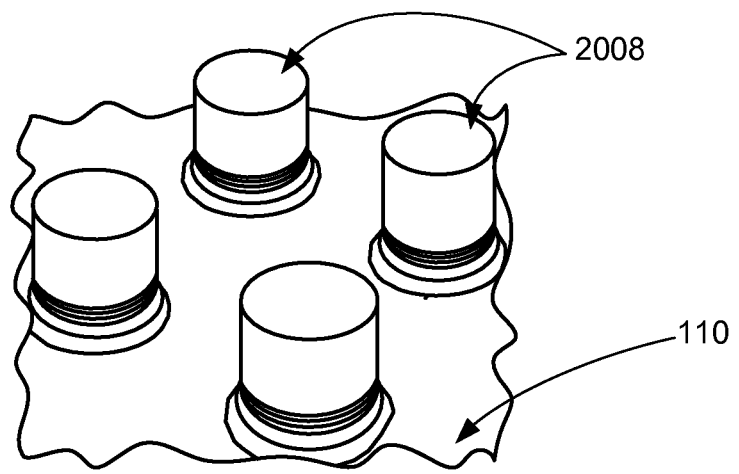
FIG. 25 is an isometric of the top view of FIG. 24.

Referring now to FIG. 25, therein is shown an isometric of the top view of FIG. 24. After the selectively deposited adhesion layer 1602 has been etched, the adhesion layer bars 1704 have been removed completely or partially. The interconnections among the UBM structures have been cut off or removed completely.

Figure 26:
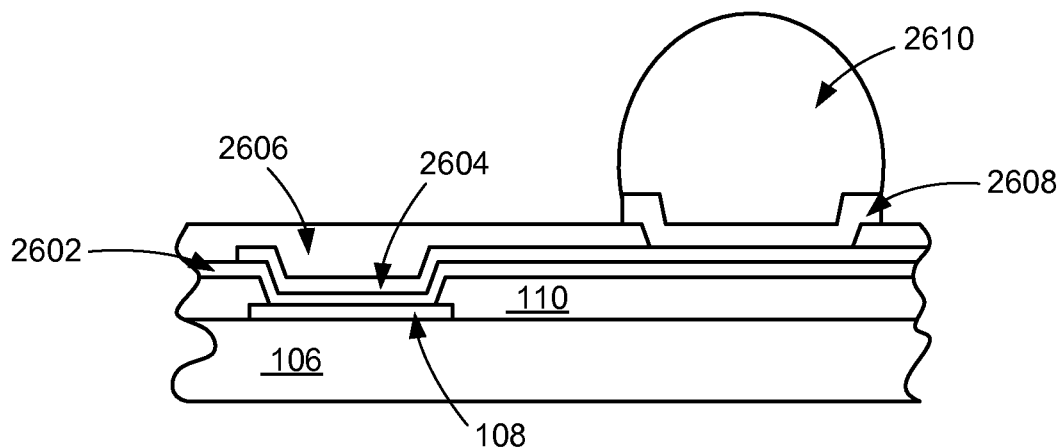
FIG. 26 is a cross-sectional view of a multi-layer UBM structure with a copper trace in accordance with an embodiment of the present invention.

Referring now to FIG. 26, therein is shown a cross-sectional view of a multi-layer UBM structure with a copper trace in accordance with an embodiment of the present invention. The aluminum pads 108 and the passivation layer 110 are formed on top of the silicon substrate 106. A re-passivation/redistribution layer 2602 is deposited on top of the passivation layer 110 and the aluminum pad 108. A copper trace layer 2604 is formed on top of the re-passivation/redistribution layer 2602. An additional protection layer 2606 covers the copper trace layer 2604, leaving an opening on the copper trace layer 2604 for deposition of an UBM layer 2608 and a solder bump 2610.

The re-passivation/redistribution layer 2602 and the additional protection layer 2606 can be formed of, but not limited to polyimide. Polyimide is a synthetic polymeric resin of a class resistant to high temperatures, wear, and corrosion when being used as a coating or film on a substrate. The copper trace layer 2604 provides connections between the aluminum pad 108 and the solder bump 2610. In a case the solder bump 2610 cannot be formed above the aluminum pad 108, the copper trace layer 2604 can redistribute connections to desired solder bump locations.

Figure 27:
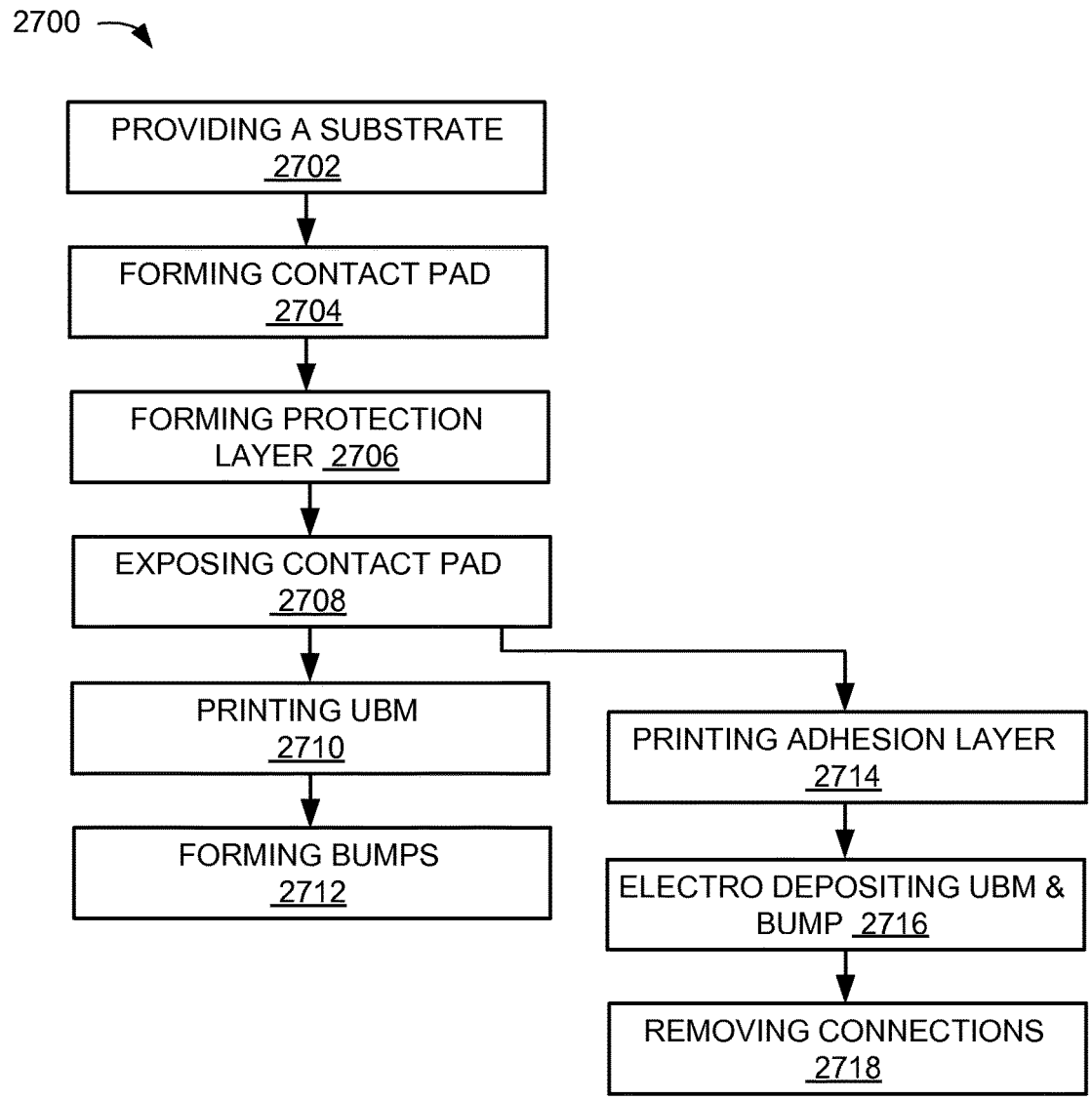
FIG. 27 is a flow chart of a method of manufacture of an integrated circuit packaging system in accordance with an embodiment of the present invention.

Referring now to FIG. 27, therein is shown a flow chart of a method 2700 of manufacture of an integrated circuit packaging system in accordance with an embodiment of the present invention. The method 2700 includes: providing a substrate in a box 2702; forming contact pads on top of the substrate in a box 2704; forming a protection layer on top of the contact pads and the substrate in a box 2706; exposing the contact pads from the protection layer in a box 2708; printing under bump metallization (UBM) layers over the exposed contact pads extended over the protection layer with conductive inks in a box 2710; and forming bumps on top of the under bump metallization layers in a box 2712.

The method 2700 also includes: printing an adhesion layer using conductive ink, wherein the adhesion layer comprises interconnected adhesion layer pads in a box 2714; forming additional under bump metallization (UBM) layers and bumps on top of the adhesion layer pads utilizing an electro-deposition process in a box 2716; and removing connections among the interconnected adhesion layer pads in a box 2718.

Figure 28:
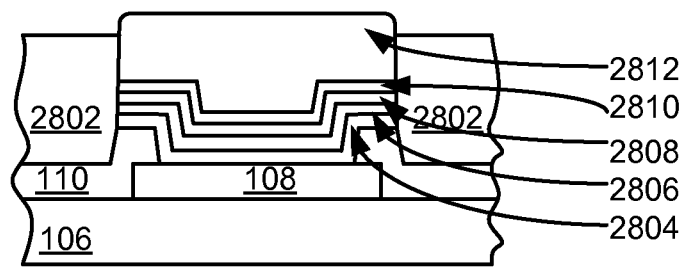
FIG. 28, is FIG. 14 in an alternative embodiment wherein a dry film resist (DFR) mask is used to form a UBM structure.

Referring now to FIG. 28, therein is shown FIG. 14 in an alternative embodiment wherein a dry film resist (DFR) mask 2802 is used to form a UBM structure.

The dry film resist mask 2802 is patterned on top of the passivation layer 110 extended over the edge of the aluminum pads 108, leaving the centre of the aluminum pads 108 exposed for deposition. The conductive ink 408 is deposited to form an adhesion layer 2804 through the patterned openings of the dry film resist mask 2802 by means of squeegee application stencil printing, or by means of spraying coating or full coverage ink jetting.

On top of the adhesion layer 2804, a solder diffusion barrier layer 2806, a solder wettable layer 2808, an oxidation barrier layer 2810, and a solder bump 2812 are deposited within the dry film resist (DFR) mask 2802, layer upon layer.

The top surface of the solder bump 2812 is slightly higher than the top surface of the dry film resist (DFR) mask 2802.

Figure 29:
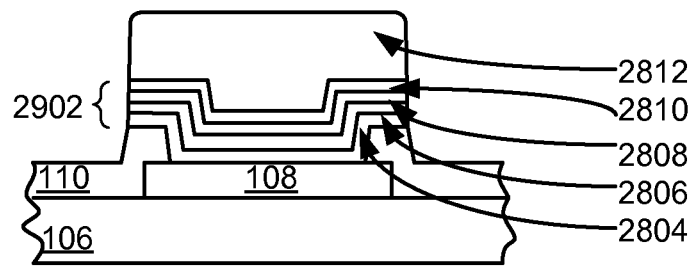
FIG. 29, is FIG. 28 after the dry film resist (DFR) mask has been removed in accordance with an embodiment of the present invention.

Referring now to FIG. 29, therein is shown FIG. 28 after the dry film resist (DFR) mask 2802 has been removed in accordance with an embodiment of the present invention. The adhesion layer 2804, the solder diffusion barrier layer 2806, the solder wettable layer 2808, and the oxidation barrier layer 2810 stacked layer upon layer to form a UBM structure 2902. The solder bump 2812 is formed on the top of the UBM structure 2902.

Figure 30:
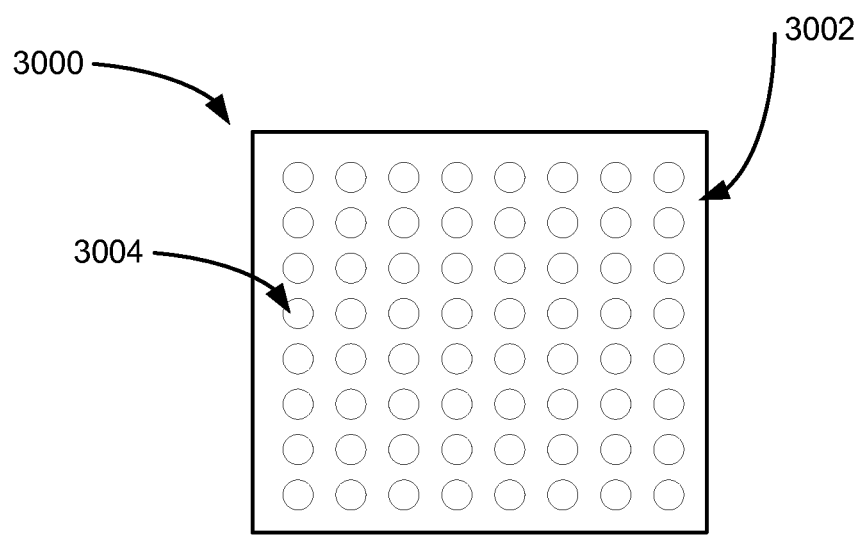
FIG. 30, is a bottom view of a semiconductor packaging system in accordance with embodiments of the present invention.

Referring now to FIG. 30, therein is shown a bottom view of a semiconductor packaging system 3000 in accordance with embodiments of the present invention. The semiconductor packaging system 3000, can be the integrated circuit packaging system 100 of FIG. 1. The semiconductor packaging system 3000 can include a protection layer 3002, external contacts 3004. The protection layer 3002 can be the passivation layer 110 of the FIG. 1. The semiconductor wafer 104 of FIG. 1 can be encased in the semiconductor packaging system 3000, mounted with UBM structures, such as the multi-layer UBM structure 802 of FIG. 8 or the UBM structure 2902 of FIG. 29. The UBM structures are capped with conductive bumps, such as the solder bump 114 of FIG. 1, the solder bump 2610 of FIG. 26, or the solder bump 2812 of FIG. 28.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems which are fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a semiconductor packaging system comprising:
    forming contact pads on top of a substrate;
    forming a protection layer on top of the contact pads and the substrate;
    exposing the contact pads from the protection layer;
    forming an under bump metallization (UBM) structure including:
        printing, with a conductive ink, an adhesion layer over the exposed contact pads extended over the protection layer,
        depositing a photo-resist over the adhesion layer,
        patterning the photo-resist to form holes in the photo-resist partially exposing the adhesion layer, and
        forming additional UBM layers, utilizing an electro-deposition process, on the adhesion layer within the holes, the additional UBM layers including a diffusion barrier layer on the adhesion layer, a wettable layer on the diffusion barrier layer, and an oxidation barrier layer on the wettable layer;
    forming a bump on top of the UBM structure; and
    removing the patterned photo-resist.

2. The method as claimed in claim 1 wherein printing the adhesion layer includes ink jet printing or stencil printing the adhesion layer with the conductive ink.

3. The method as claimed in claim 1 wherein printing the adhesion layer includes printing the adhesion layer using multiple types of conductive inks layer upon layer.

4. The method as claimed in claim 3 wherein the conductive inks are made of a single type of metal, metal alloy, or mixture of different metals or alloys.

5. The method as claimed in claim 1 wherein printing the adhesion layer includes dispensing a predetermined amount of the conductive ink to deposit a uniform thickness of the adhesion layer.

6. The method as claimed in claim 1 wherein printing the adhesion layer includes printing adhesion layer pads and adhesion layer bars on the protection layer, at least one of the adhesion layer bars connected to multiple of the adhesion layer pads.

7. A method of manufacture of an integrated circuit packaging system comprising:
    forming aluminum pads on top of a silicon substrate;
    forming a passivation layer on top of the aluminum pads and the silicon substrate;

exposing the aluminum pads from the passivation layer;
forming an under bump metallization (UBM) structure including:
   printing, with a conductive ink, an adhesion layer over the exposed aluminum pads extended over the passivation layer,
   depositing a photo-resist over the adhesion layer,
   patterning the photo-resist to form holes in the photo-resist partially exposing the adhesion layer, and
   forming additional UBM layers, utilizing an electro-deposition process, on the adhesion layer within the holes, the additional UBM layers including a diffusion barrier layer on the adhesion layer, a wettable layer on the diffusion barrier layer, and an oxidation barrier layer on the wettable layer;
forming solder bumps on top of the under bump metallization structure; and
removing the patterned photo-resist.

8. The method as claimed in claim 7 wherein printing the adhesion layer includes ink jet printing or stencil printing the adhesion layer with the conductive ink.

9. The method as claimed in claim 7 wherein printing the adhesion layer includes printing the adhesion layer using multiple types of the-conductive inks layer upon layer.

10. The method as claimed in claim 9 wherein the conductive inks are made of a single type of metal, metal alloy, or mixture of different metals or alloys.

11. The method as claimed in claim 7 wherein printing the adhesion layer includes dispensing a predetermined amount of the conductive ink to deposit a uniform thickness of the adhesion layer.

12. The method as claimed in claim 7 wherein printing the adhesion layer includes printing adhesion layer pads and adhesion layer bars on the protection layer, at least one of the adhesion layer bars connected to multiple of the adhesion layer pads.

* * * * *

UNITED STATES PATENT AND TRADEMARK OFFICE
CERTIFICATE OF CORRECTION

PATENT NO. : 9,865,554 B2
APPLICATION NO. : 14/955033
DATED : January 9, 2018
INVENTOR(S) : Il Kwon Shim et al.

It is certified that error appears in the above-identified patent and that said Letters Patent is hereby corrected as shown below:

In the Claims

Column 16
Claim 9: Line 6: Delete "the-conductive" and insert --conductive--

Signed and Sealed this
Fifth Day of June, 2018

Andrei Iancu
*Director of the United States Patent and Trademark Office*